(12) United States Patent
Al-Shamma et al.

(10) Patent No.: US 6,463,003 B2
(45) Date of Patent: *Oct. 8, 2002

(54) POWER SAVING SCHEME FOR BURST MODE IMPLEMENTATION DURING READING OF DATA FROM A MEMORY DEVICE

(75) Inventors: Ali K. Al-Shamma, San Jose; Takao Akaogi, Cupertino, both of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/729,388

(22) Filed: Dec. 4, 2000

(65) Prior Publication Data

US 2001/0050874 A1 Dec. 13, 2001

Related U.S. Application Data

(60) Provisional application No. 60/210,134, filed on Jun. 7, 2000.

(51) Int. Cl.[7] .................................................. G11C 8/00
(52) U.S. Cl. ....................................... 365/227; 365/226
(58) Field of Search .................................. 365/227, 226

(56) References Cited

U.S. PATENT DOCUMENTS 5,996,041 A    11/1999   Kim .......................... 711/103
6,292,425 B1 * 9/2001   Al-Shamma et al. ....... 365/227

FOREIGN PATENT DOCUMENTS

DE   199 37 829 A1   2/2000   ............. G11C/7/00
JP   0045997   *   3/1985   ............ G11C/11/34

OTHER PUBLICATIONS

Betty Prince, "Semiconductor Memories", 1983, Wiley, 2$^{nd}$ pp. 48–50.*

* cited by examiner

Primary Examiner—M. Tran

(57) ABSTRACT

Reading data from a core memory consumes more power when the data sets being driven change state, especially when bursting out the data at high speed. Power saving for a burst mode implementation improves the power consumed by inverting the data sets whenever a majority of the data changes states from set to set and including a separate output indicating whether the data being driven is inverted. Present data is selected from the core memory and clocked into the power saving arrangement. The present data is compared with previously selected data to determine whether the majority of data presently selected has changed from the previously selected data. In addition, the present selected data is also delayed and then subjected to a logical XOR function with the majority determination above. Finally, the data subjected to the logical XOR function and the majority determination are driven separately to external elements requesting the present data. Thus, power is saved as the state of the majority of the data being driven from one data set to the next remains unchanged.

12 Claims, 6 Drawing Sheets

POWER SAVING SCHEME FOR BURST MODE IMPLEMENTATION DURING READING OF DATA FROM A MEMORY DEVICE

CROSS REFERENCE TO RELATED APPLICATIONS

This Application claims the benefit under 35 U.S.C. §119(E) of the U.S. Provisional Application Ser. No. 60/210,134, filed on Jun. 7, 2000.

FIELD OF THE INVENTION

The present invention relates to the field of memory devices. More particularly, the invention relates to a method and arrangement for power saving for a burst mode implementation during reading data from a memory device.

BACKGROUND OF THE INVENTION

The overall array architecture for a typical integrated circuit containing a memory includes a core memory, herein referred to as a core, and input/output circuitry, herein referred to as the periphery. The core generally contains a plurality of core cells (i.e. individual memory elements) that are arranged in an array of rows and columns. The core cells store at least one bit of data and are accessed through the periphery to external elements, such as a microprocessor, which require the data.

When the core is accessed, the microprocessor or other external element requests data stored in the core. Power is consumed both reading the data from the core to the periphery and driving the data onto the bus connecting the periphery and microprocessor. In general, there is a constant need to decrease the amount of power consumed while providing more powerful and faster elements and circuitry. Either decreasing the power used by individual components or minimizing the power used by the entire access process decreases the power used in retrieving sets of data from the core (either individual sets of bits, words or bytes, depending on the arrangement) and driving the sets of data along the bus to be read by a microprocessor or other external elements.

It is desirable to produce arrangements in which the power consumption is reduced. For example, large amounts of power are consumed when driving retrieved data along the bus dependent on the dynamical changes between successive sets of data being driven. This is to say that, power is consumed when data occupying a position on the bus (say data 0 occupying position 1) and being driven along the bus during one clock cycle changes states (say data 1 occupying position 1) and is driven along the bus during the next clock cycle. If the data occupying a particular position on the bus does not change from one clock cycle to the next clock cycle, significantly less power is consumed.

Thus, it is advantageous to produce an arrangement in which the power consumption is reduced when driving successive sets of data to the bus, thereby increasing battery lifetime in portable computers, for example.

BRIEF SUMMARY OF THE INVENTION

In view of the above, an advantage of the present invention is to reduce the amount of power used in driving sets of data along the bus, particularly during modes when data is "burst out" from the memory at high speed. An embodiment of the present invention is a power saving method during burst mode reading of data from a memory device in which data is presently selected from a core memory. The method includes determining whether majority of the presently introduced data has changed from previously introduced data from the core memory. The present data is subjected to an exclusive or logic function (XOR) with the majority determination and this data as well as the majority determination are driven separately to external elements requesting the present data.

Another embodiment of the present invention is a power saving arrangement during burst mode reading of data from a memory device in which a core memory contains selectable data. A determining mechanism determines whether the majority of data presently selected from the core cell has changed from previously selected data from the core memory. A plurality of first XOR gates subject the present data to an exclusive-or logic function with the majority determination. A plurality of drivers separately drive both this data and the majority determination. In this manner power is saved, as the state of the majority of the data being driven from one data set to the next remains unchanged.

The following figures and detailed description of the preferred embodiments will more clearly demonstrate these and other objects and advantages of the invention.

DETAILED DESCRIPTION OF THE PRESENTLY PREFERRED EMBODIMENTS OF THE INVENTION

The overall architecture for a typical integrated circuit containing a memory includes a core and sets of row decoders and column decoders and/or multiplexors. The core usually contains information stored in individual memory elements called core cells that are accessed by the row (or word line) decoders, which are used to access specific memory rows within a particular memory block of the core. The core also contains column decoders and/or multiplexors, which are used to access specific memory columns within a particular memory block of the core. Thus, any core cell within the memory array is selectable by use of the row decoders and column decoders and/or multiplexors.

The core cells may be constructed from any structure capable of retaining state (bit) information and suitable for high-speed access to elements external to the core, e.g. a microprocessor. Typical core cells may be non-volatile memory elements such as non-volatile transistors or charge-carrying devices. A single core cell may hold either a single bit (i.e. 0 or 1) or multiple bits (e.g. 0, 1, 2, 3) depending on the type of non-volatile transistors used, for example. The core may be either only readable or read/writable, that is to say that the core cells may store one set of information permanently or may be able to overwrite information contained in the core cells. In one application, when the core cell is accessed, a voltage is applied to the gate (or base) of the transistor comprising the core cell and either the current or voltage at a predetermined test point corresponding to the selected core cell is examined to determine the data contained in the core cell. Typically multiple core cells are accessed at the same time and the data is read into/out of individual bit lines.

Figure 1:
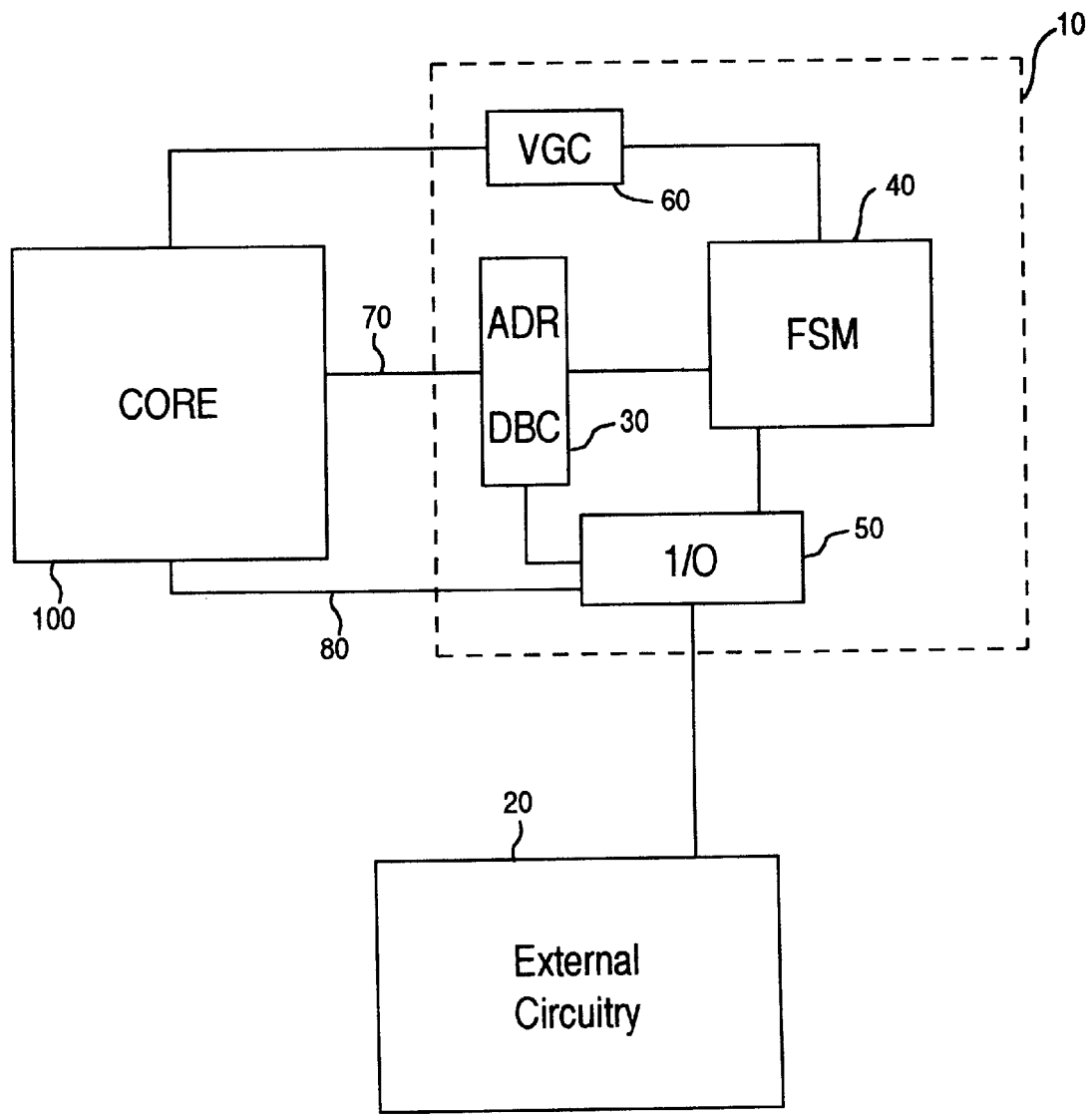
FIG. 1 shows a block diagram of the overall architecture according to an embodiment of the invention.

FIG. 1 shows an overall block diagram of a first embodiment of the present invention. The overall architecture comprises a memory integrated circuit 1, i.e. a core 100 and periphery 10, as well as circuitry 20 external to the memory integrated circuit 1. In FIG. 1, the core 100 is connected with the periphery 10, which is in turn connected with the external circuitry 20. In general, the periphery 10 includes an address decoder 30, a finite state machine (FSM) 40, data input/output circuitry 50, and a voltage generating circuit (VGC) 60. The FSM 40 controls overall operation of the periphery 10 and may be part of external circuitry 20. The VGC 20 generates necessary voltages for reading and writing data into and out of the core 100. The data input/output circuitry 50 provides a two-way data path between the core 100 and the external circuitry 20. The periphery 10 receives a request for data containing input addresses from the external circuitry 20, which is subsequently decoded by the address decoder 30.

The address decoder 30 includes both the bit line and word line decoders and decodes the addresses of desired core cells in the core 100. Data is communicated with the periphery 10 and the external circuitry 20 through the data in/out circuitry 50. The address signal decoded by the address decoder 30 is a multiple bit address defining one or more unique locations in the core 100 for accessing data. The address decoder 30 decodes the input address and selects at least one bit line 80 and at least one word line 70 in the core 100.

Figure 2:
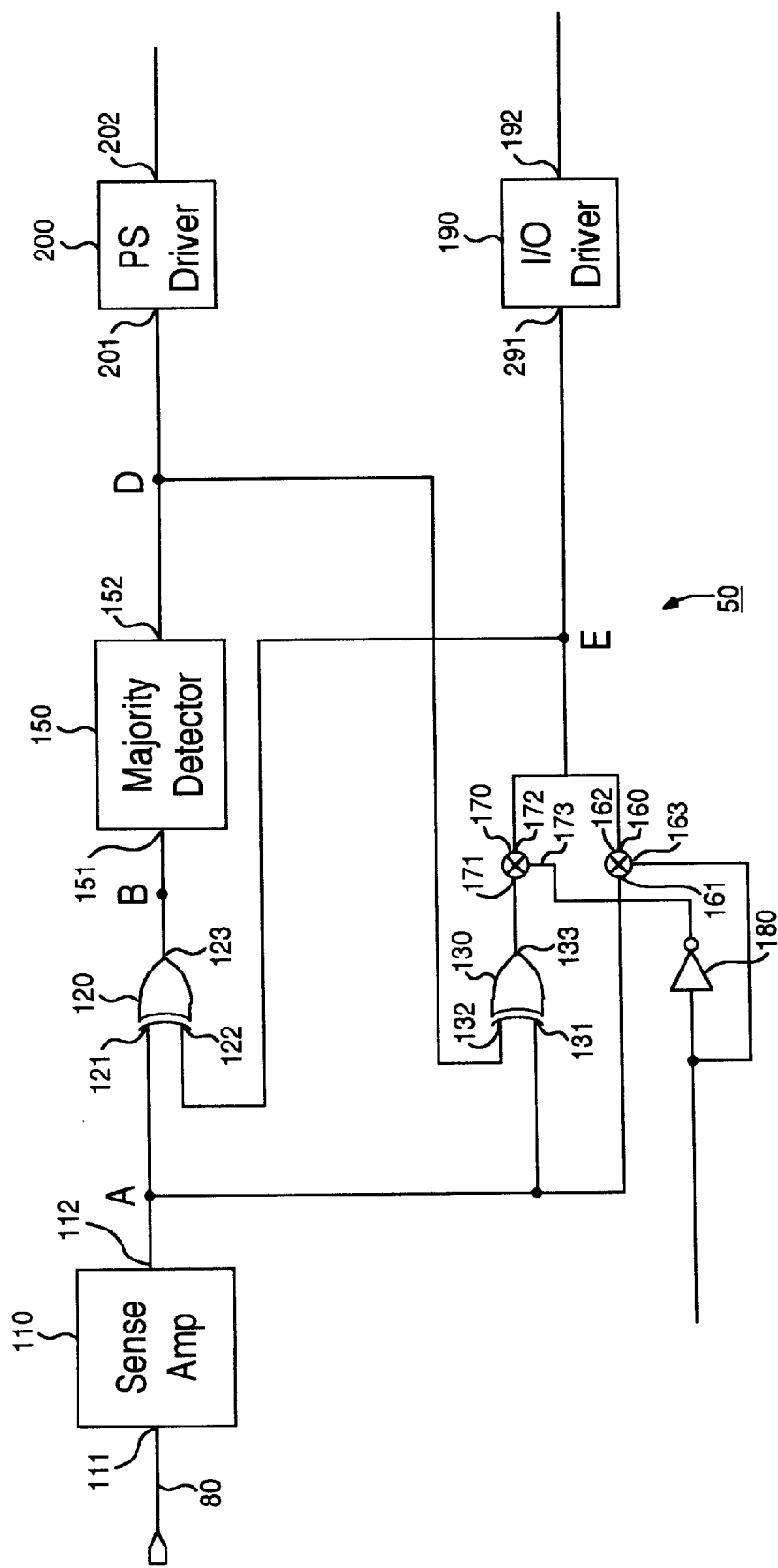
FIG. 2 illustrates a block diagram of the overall architecture of the power saving circuit according to an embodiment of the invention.

An arrangement of the power saving I/O circuitry 50 according to the preferred embodiment is illustrated in FIG. 2. The power saving I/O circuitry 50 includes a sample amplifier 110, a first and a second exclusive or (XOR) gates 120, 130, a majority detector 150, a first and second bypass switch 160, 170, an inverter 180, and a pair of drivers (PS and I/O) 190, 200.

The input 111 of the sample amplifier 110 is a bit line 80 containing data and connected with at least one core cell in the core 100. The output 112 of the sample amplifier 110 is connected with an input 121, 131 of each the first and second exclusive-or (XOR) gate 120, 130 and the first bypass switch 160. The output 123 of the first XOR gate 120 is connected with an input 151 of the majority detector 150, described below. The output 152 of the majority detector 150 is connected with the other input 132 of the second XOR gate 130 and an input 201 of the PS driver 200. The output 133 of the second XOR gate 130 is connected with an input 171 of the second bypass switch 170.

The first and second bypass switches 160, 170 have controls 163, 173, respectively, that receive a bypass signal. The first and second bypass switches 160, 170 are switched by the bypass signal received at the control 163, 173. Outputs 162, 172, respectively, of the first and second bypass switches 160, 170 are tied together. The control 163 of the first bypass switch 160 is directly connected with the bypass signal and the control 173 of the second bypass switch 170 is connected with the bypass signal through the inverter 180. When the bypass signal is high, the first bypass switch 160 is closed, the output 112 of the sample amplifier 110 is connected to the output 162 of the first bypass switch 160 and the second bypass switch 170 is open. Conversely, when the bypass signal is low, the second bypass switch 170 is closed, the output 133 of the second XOR gate 130 is connected to the output 172 of the second bypass switch 170 and the first bypass switch 160 is open.

The switched output signal from the first and second bypass switches 160, 170, i.e. either the output signal from the sample amplifier 110 or the output signal from the second XOR gate 130, are connected with an input 191 of the I/O driver 190 and the other input 122 of the first XOR gate 120. The first and second bypass switches 160, 170 may be simple transistors (MOSFET or bipolar) or may be more complicated switching circuits. The I/O driver 190 and PS driver 200 drive data and an inversion bit respectfully to external elements along the bus.

The sample amplifier 110 amplifies the data from the bit line 80. The output signal of the sample amplifier 110 from the present clock cycle will be called the present data. The output signal of the sample amplifier 110 from the previous clock cycle will be called the previous data. The inputs 121, 122 of the first XOR gate 120 are the present data and the previous data. The first XOR gate 120 determines whether the present data and the previous data are the same or are different. If the present data and the previous data are the same, the output signal of the first XOR gate 120 is low (ground, 0). If the present data and the previous data are different, the output signal of the first XOR gate 120 is high (Vcc, 1). In general, high and low outputs correspond to output voltages of Vcc and ground.

Note that the diagram of FIG. 2 is shown and described in reference to a single bit of data, however, any number of bits may be read to be driven along the bus in each cycle. In a multiple bit embodiment, each bit has the corresponding set of circuitry shown in FIG. 2. However, in such an embodiment, the majority detector 150 and PS driver 200 may be common to all of the circuitry. Thus, the majority detector 150 receives the output signal of the first XOR gate 120 from all of the bits and determines not whether an individual bit has changed, but whether the majority of the individual bits in the set of present data have changed from the corresponding individual bits in the set of previous data. If a majority of the individual bits have changed, the output signal of the majority detector 150 is high. If a majority of the individual bits have remained the same, the output signal of the majority detector 150 is low.

Figure 3:
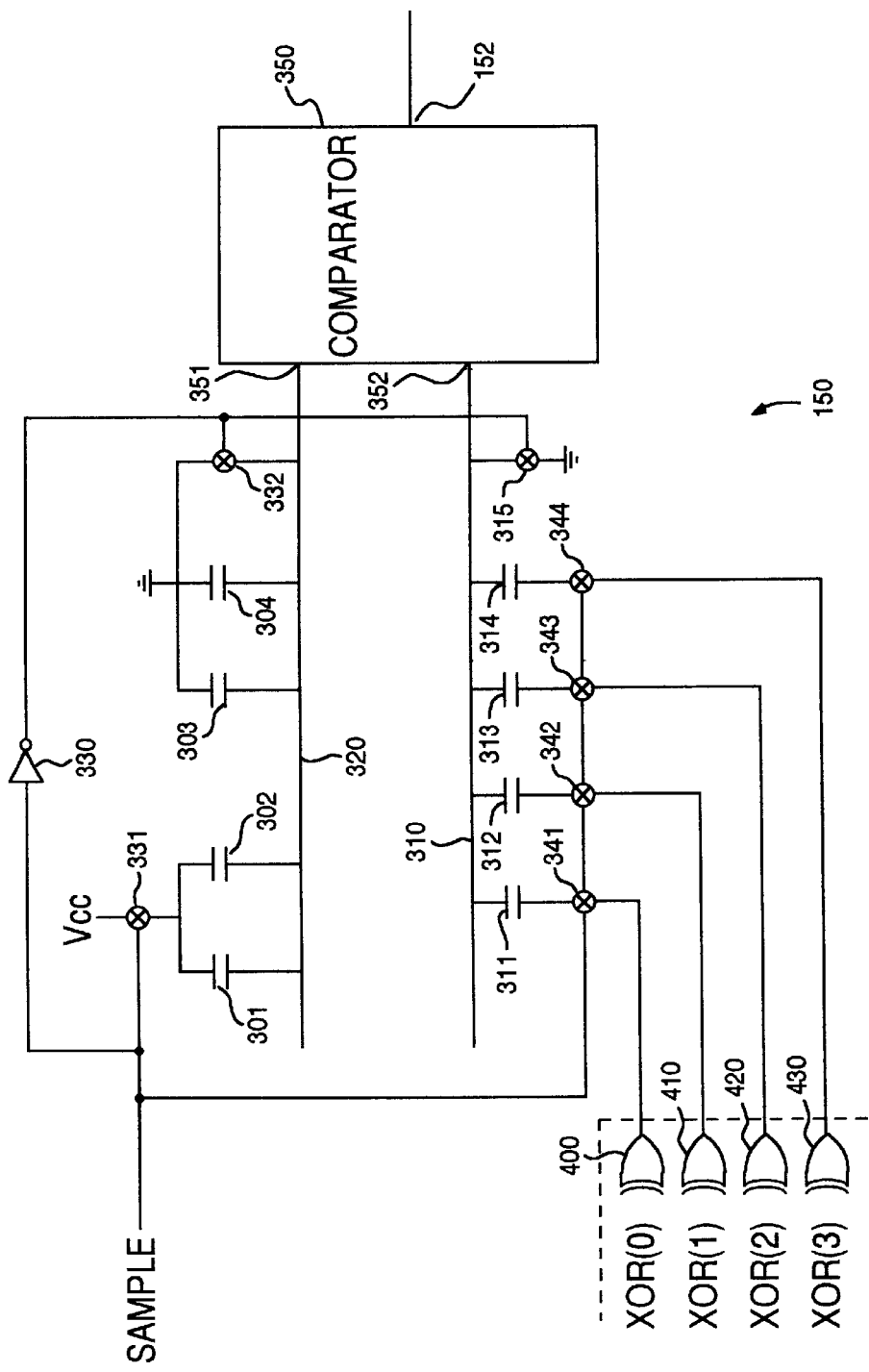
FIG. 3 illustrates an embodiment for the majority detector according to the present invention.

FIG. 3 is a diagram of the majority detector 150. For illustrative purposes, the majority detector 150 uses the outputs from four XOR gates. This is to say that the majority detector 150 determines whether the majority of bits in a four-bit word have changed from the previous four-bit word to the present four-bit word. Typically however, a set of data (word) is comprised of 16 individual bits read out at one time rather than 4 bits.

The majority detector 150 comprises a comparator 350 having two inputs 351, 352, a dummy line 320 and a data line 310, a set of dummy capacitors 301, 302, 303, 304, a set of data capacitors 311, 312, 313, 314, a dummy capacitor power switch 331, a dummy line grounding switch 332, an inverter 330, a set of data switches 341, 342, 343, 344 and a data line grounding switch 345. The dummy line 320 is connected with the first input 351 of the comparator 350 and the data line 310 is connected with the second input 352 of the comparator 350. The output signal of the comparator 350 is low when the voltage on the dummy line 320 is larger than the voltage on the data line 310 and high when the voltage on the dummy line 320 is smaller than the voltage on the data line 310.

The voltage on the dummy line 320 is a test level to which a combined voltage level (from the XOR gates 400, 410, 420, 430) on the data line 310 is compared. The dummy line 320 is connected with ground through a first pair of capacitors 303, 304 in parallel and a first dummy switch 332 in parallel with the first pair of capacitors 303, 304. The dummy line 320 is connected with a second pair of capacitors 301, 302 in parallel and a second dummy switch 331 in series with the second pair of capacitors 301, 302. The second dummy switch 331 is also connected with Vcc. The first and second dummy switches 331, 332 are operated using a sample signal. The second dummy switch 331 is closed (turned on) by the sample signal and the first dummy switch 332 is closed by the inverse of the sample signal. Thus, when the sample signal is low, the dummy line 320 is connected with ground. When the sample signal is high, the dummy line 320 is connected with the first pair of capacitors 303, 304, which are connected with ground, and the second pair of capacitors 301, 302, which are connected with Vcc, and thus the dummy line 320 charges to Vcc/2. This is assuming that all of the capacitors have the same value of capacitance. However, the capacitance of the capacitors may be altered depending on the voltage level desired on the dummy line 320 to anywhere between ground and Vcc.

The data line 310 is connected with a set of four capacitors 310, 311, 312, 313, all connected in parallel, and connected with ground through the data line grounding switch 345 in parallel with the set of capacitors 310, 311, 312, 313. The data line grounding switch 345 is controlled by the inverse of the sample signal, similar to the first dummy switch 332, so that when the sample signal is low, the data line 310 is grounded and when the sample signal is high, the data line ground switch 345 is open.

The first capacitor 311 in this set is connected with the output signal from the first XOR gate 400 through a first data switch 341. Similarly, the second capacitor 312 in this set is connected with the output signal from the second XOR gate 410 through a second data switch 342, the third capacitor 313 in this set is connected with the output signal from the third XOR gate 420 through a third data switch 343, and the fourth capacitor 314 in this set is connected with the output signal from the fourth XOR gate 430 through a fourth data switch 344.

The set of data switches 341, 342, 343, 344 are controlled by the sample signal. Thus, only when the sample signal is high are the data switches 311, 312, 313, 314 closed and the data line 310 charged to a voltage above ground. Note that, as above, all switches in the various embodiments of the different circuitry described herein may be simple transistors (MOSFET or bipolar) or may be more complicated switching circuits.

As above, if all of the capacitors connected with both the dummy line 320 and the data line 310 have equal values, then the voltage level on the data line 310 is larger than the voltage level on the dummy line 320 only when the majority (>2) of the XOR gates 400, 410, 420, 430 are high. This is to say that the voltage level on the data line 310 is larger than the voltage level on the dummy line 320 if the majority of the state of the individual data being tested has changed from the previous data to the present data. Thus, in this case, when the sample signal becomes high, if three of the four XOR gates 400, 410, 420, 430 are high, then the voltage on the data line 310 becomes ¾ Vcc, as compared to the voltage on the dummy line 320, which is ½ Vcc, and the output signal of the comparator becomes high.

Another method of arranging the majority detector 150 may be to use an extra capacitor along the dummy line 320 connected with Vcc creating a small offset such that the dummy line 320 and the data line 310 can never attain the same voltage. Thus, in a typical arrangement, 9 dummy capacitors would be connected with Vcc, 8 dummy capacitors would be connected with ground (making a total of 17 dummy capacitors) and 16 data capacitors would be each connected with individual data from the corresponding XOR gates.

Figure 4:
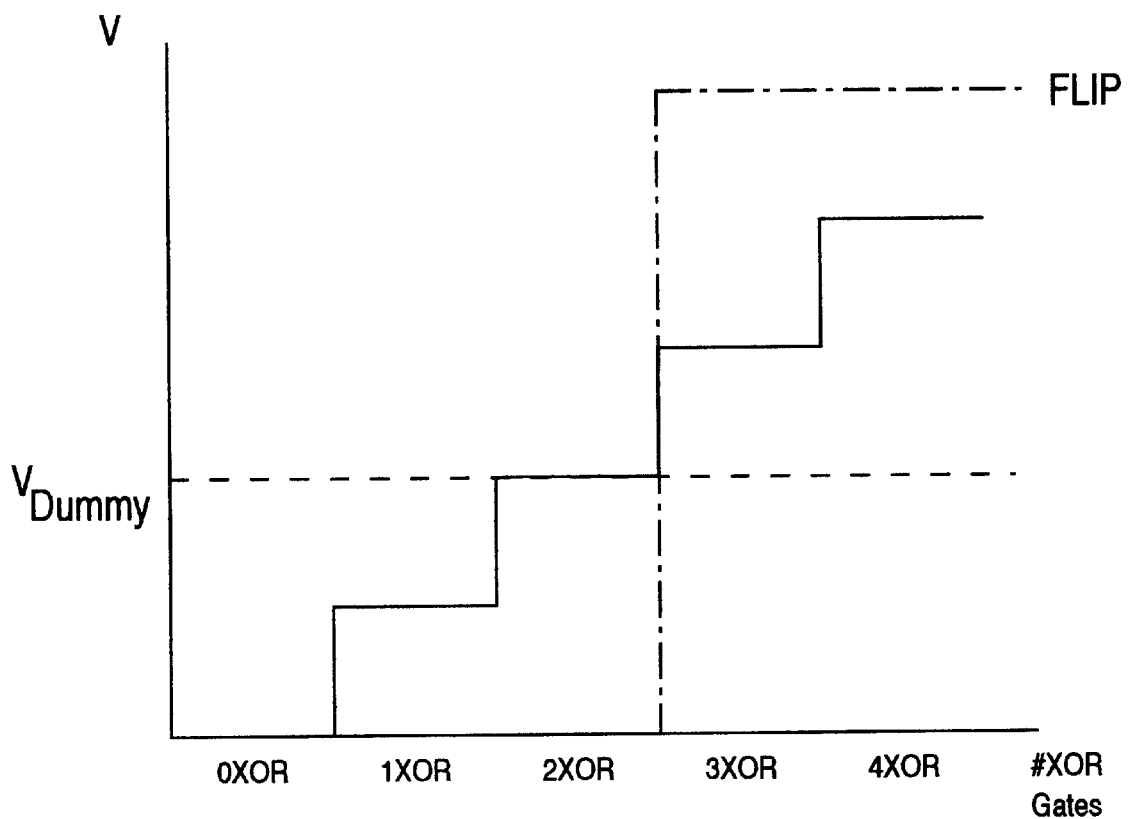
FIG. 4 shows the transition for inversion for a set number of bits according to the present invention.

FIG. 4 shows typical variations of the voltage along data line 310 as a function of the output signal from the combined XOR gates 400, 410, 420, 430, the voltage along the dummy line 320 and the output signal from the comparator 350 for this implementation. In FIG. 4, the voltage of the data line 310 is shown as a function of the number of XOR gates that are high. After the voltage of the data line 310 is larger than the voltage of the dummy line 320 (indicated by the dashed line), the signal to invert goes high (FLIP or the dot-dashed line).

Figure 5:
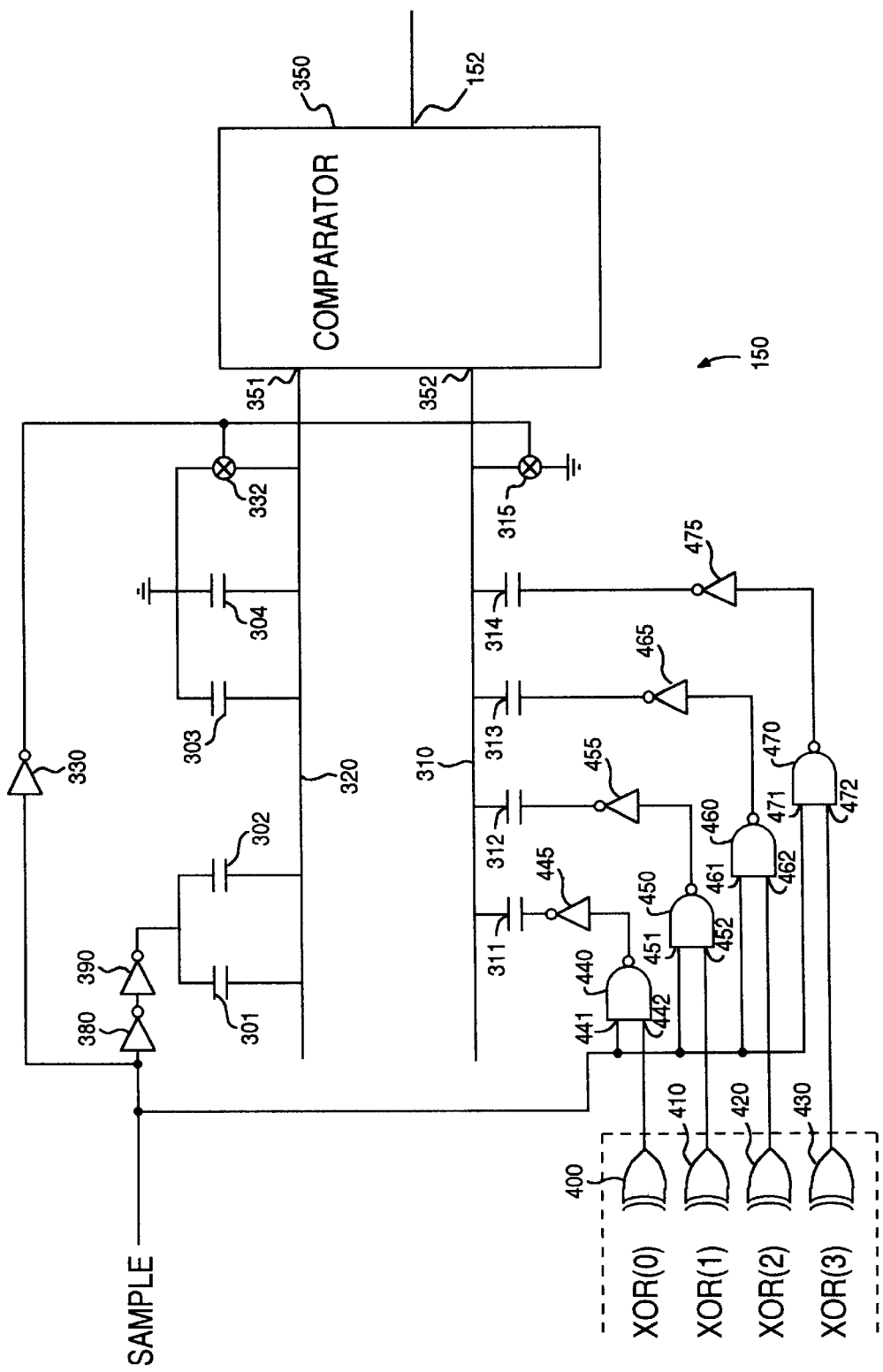
FIG. 5 illustrates a second embodiment for the majority detector according to the present invention.

In addition, rather than being connected with Vcc, the second pair of capacitors 301, 302 (FIG. 3) may be connected with the sample signal. In this case, the sample signal may require appropriate buffering prior to being supplied to the switches connected with the capacitors (both on the dummy line 320 and the data line 310) for timing purposes. One implementation of this buffering scheme, as shown in FIG. 5, may be to buffer the sample signal, switching the second dummy switch 331 using a pair of inverters 380, 390 and not using data switches. In this case, the output signal from the individual XOR gates 400, 410, 420, 430 may be connected with the data capacitors 311, 312, 313, 314 through a NAND gate/inverter combination. The inputs of each NAND gate are the sample signal and the output signal of the corresponding XOR gate. The output signal of each NAND gate is used as an input to the corresponding inverter. The output signal of each inverter is connected with the corresponding individual data capacitor. For example, the first input 441 of the first NAND gate 440 is the sample signal and the second input 442 of the first NAND gate 440 is the output signal of the first XOR gate 400. The output signal of the first NAND gate 440 is used as an input to the first inverter 445. The output signal of each inverter is connected with the first data capacitor 311. When using this implementation, it may also be desirable to buffer any clock signal used to trigger the comparator 350, say by using a pair of inverters (not shown).

As above, if the majority of the present data and the previous data are the same, the PS driver 200 drives a low signal to the PS output 202, while if the majority of the present data and the previous data are different the PS driver 200 drives a high signal to the PS output 202. A low signal on the PS output 202 signifies that the data being driven by the I/O driver 190 (on the output 192 of the I/O driver 190) during the present clock cycle is true. Conversely, a high signal on the PS output 202 signifies that the data being driven by the I/O driver 190 during the present clock cycle is inverted.

The logical exclusive-or function of the second XOR gate 130 of FIG. 2 will now be described in more detail. Once again, a low signal is typically relatively close to ground, while a high signal is typically relatively close to Vcc.

In FIG. 2, one input 132 of the second XOR gate 130 is connected with present data from the sample amplifier 110 and the other input 131 of the second XOR gate 130 is connected with the output signal of the majority detector 150. As above, if the majority of the present data has changed, the output signal of the majority detector 150 is high and one of the input signals of the second XOR gate 130 is high. If the present data is low, the input signals of the second XOR gate 130 are high and low, in which case the output signal of the second XOR gate 130 is high. Similarly, if the present data is high, the input signals of the second XOR gate 130 are high and high, in which case the output signal of the second XOR gate 130 is low. Thus, the output signal of the second XOR gate 130 is the inverse of the present data.

Alternately, if the majority of the present data has remained the same, the output signal of the majority detector 150 is low and one of the input signals of the second XOR gate 130 is low. If the present data is low, the input signals of the second XOR gate 130 are low and low, in which case the output signal of the second XOR gate 130 is low. Similarly, if the present data is high, the input signals of the second XOR gate 130 are high and low, in which case the output signal of the second XOR gate 130 is high. Thus, the output signal of the second XOR gate 130 is merely the present data.

As above, the outputs 162, 172 of the first switch 160 and second switch 170 are tied together. The first switch 160 is switched by the bypass signal and the second switch 170 is switched by the inverse of the bypass signal, i.e. only one of the switches is on at any time. Thus, these switches allow the I/O driver 190 to switch between driving the output signal of the second XOR gate 130 and the present data. This is useful, for example, because the first set of data driven to the bus by the I/O driver 190 is not compared to a set of previous data (as no previous data exists). A single transistor, multiple transistors or any other known switching device may be used to implement each switch described in the present invention. For a single transistor, the appropriate sample signal or inverted sample signal is connected with the gate or base of the transistor. The output signal of the first switch 160 and second switch 170 is also used as an input signal to the first XOR gate 120.

Figure 6:
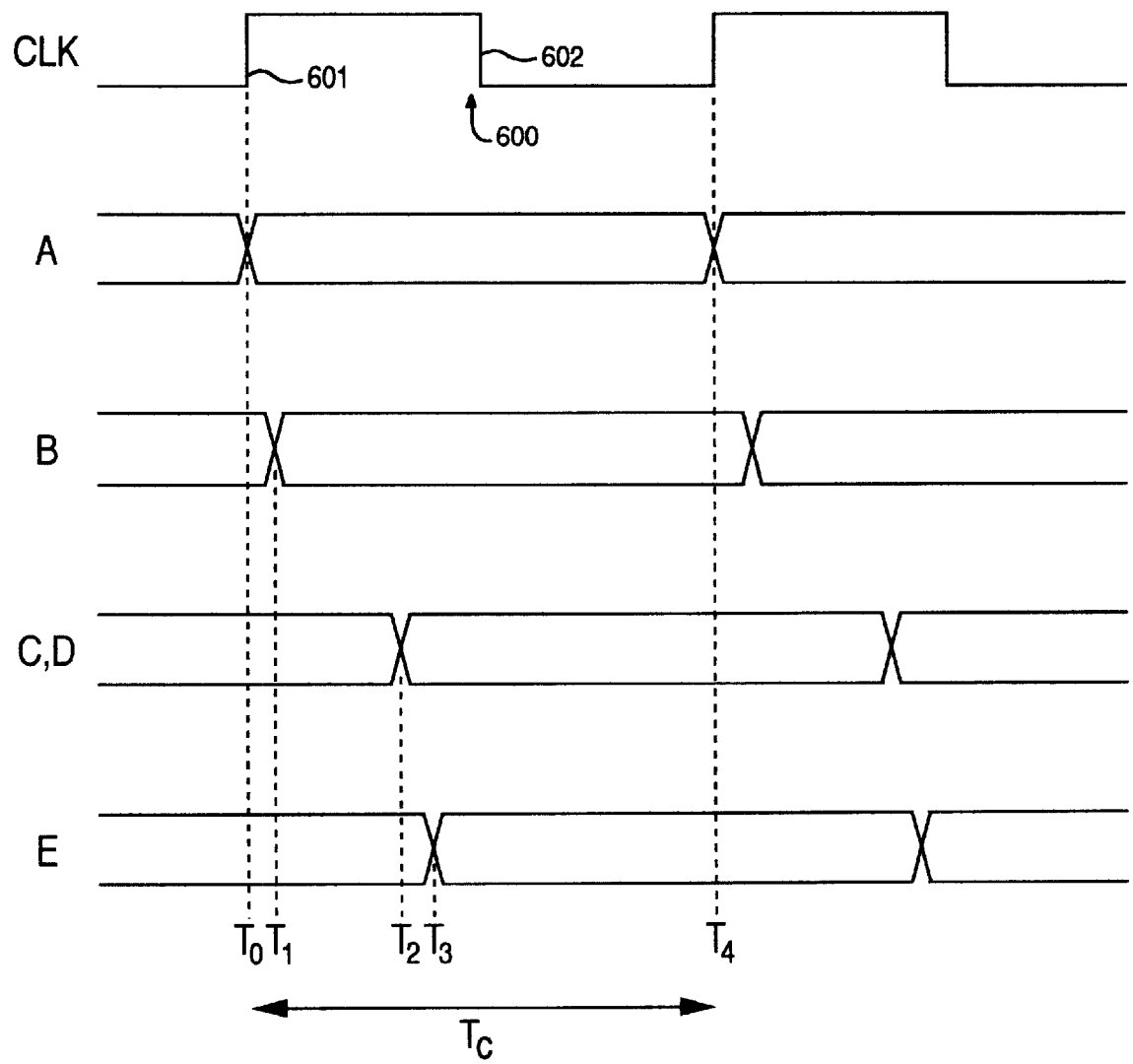
FIG. 6 illustrates timing diagrams according to an embodiment of the invention.

In the above arrangement, the data is clocked through the system. Typically, a clock cycle will be about 25 ns in duration (40 MHz output speed), but the evaluation time may be faster. The throughput of the I/O circuitry 50 is important when "bursting out" data at high speeds. FIG. 6 illustrates a timing diagram according to the embodiment of the invention shown in FIG. 2.

In FIG. 6, data from the core cells is on the bitlines 80 connected with the sample amplifier 110. $T_c$ denotes the width of the clock pulse. At time $T_0$ (the rising edge 601 of the clock pulse 600), the input signal to the sample amplifier 110, i.e. the present data, is clocked through the sample amplifier 110 to an input 121 of the first XOR gate 120. The output signal of the first XOR gate 120 is supplied to the input 151 of the majority detector 150 at time $T_1$, the falling edge 602 of the clock pulse 600 (~12 ns). At time $T_2$ (usually ~17 ns), the majority detector 150 has determined whether more than half of the output signals of the first XOR gates are high and the output signal of the majority detector 150 is supplied to an input 132 of the second XOR gate 130. The output signal of the majority detector 150 is subjected to an XOR logic function with the present data in the second XOR gate 130 and the next set of present data is clocked through the sample amplifier 110 on the rising edge 611 of the next clock pulse 610 ($T_3$~25 ns). The data driver 190 subsequently drives the output signal of the second XOR gate 130 (the present data which is considered the "previous" data for the next set of "present" data) and the PS driver 200 drives the output signal of the majority detector 150, also used as the other input to the exclusive-or logic function with the present data, on the rising edge 611 of the next clock pulse 610 (~50 ns). The drivers typically require about 6 ns to drive an output onto the external bus. The total time that the present data requires to appear on the external bus, i.e. the throughput time of this section of the data input/output circuitry 50, is two complete clock cycles and the amount of time to drive the present data (~56 ns).

Thus, input/output circuitry is presented in which power consumption is reduced by decreasing dynamical changes between successive sets of data being driven to external circuitry during burst mode reading of data from a memory device. The present invention accomplishes this by comparing the set data to be driven with the previous set of data driven. If a majority of the set data to be driven is different from the previous set of data driven, the set data to be driven is first inverted and then driven. An inversion bit is driven along with the present set of data to indicate whether the set of data presently being driven is inverted. Thus, power consumption is reduced when driving successive sets of data from the memory to the bus connected with the external circuitry requiring the data.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

We claim:

1. A method of power saving for a burst mode implementation during reading of data from a memory device comprising:

introducing data presently selected from a core memory;

determining whether a majority of the presently introduced data has changed from previously introduced data from the core memory;

subjecting the presently introduced data to a first logical XOR function with the determination of whether the majority of the presently introduced data has changed from the previously introduced data;

separately driving the data subjected to the first logical XOR function and the determination of whether the majority of the presently introduced data has changed from the previously introduced data to external elements requesting the presently introduced data, wherein the introducing and driving are performed synchronously with a clock pulse.

2. The method of claim 1, the determining comprising:

subjecting the presently introduced data and the previously introduced data to a second logical XOR function; and presenting the presently and previously introduced data subjected to the second logical XOR function to a majority detector.

3. The method of claim 2, the determining further comprising:

charging a first set of capacitors to a voltage corresponding to a number of individual bits of the presently and previously introduced data subjected to the second logical XOR function presented to the majority detector that are different; and comparing a combined voltage of the plurality of capacitors to a predetermined voltage.

4. The method of claim 3, the determining further comprising:

producing the predetermined voltage by charging a second set of capacitors at substantially the same time as the first set of capacitors are being charged.

5. The method of claim 1, further comprising providing a bypass route to bypass the determination and the subjection of the presently introduced data to the first logical XOR function with the determination of whether the majority of the presently introduced data has changed from the previously introduced data such that presently introduced data may be driven without being compared with previously introduced data.

6. The method of claim 1, wherein the subjection of the presently introduced data and the previously introduced data to the second logical XOR function is performed synchronously with a clock pulse.

7. An arrangement of power saving for a burst mode implementation during reading of data from a memory device comprising:

a core memory containing selectable core cells having data;

a determining mechanism to determine whether a majority of data presently selected from the core cell has changed from previously selected data from the core memory;

a plurality of first XOR gates to subject the presently selected data to a first logical XOR function with the determination of whether the majority of the presently selected data has changed from the previously selected data;

a plurality of drivers to separately drive the data subjected to the first logical XOR function and the determination of whether the majority of the presently selected data has changed from the previously selected data to external elements requesting the presently selected data, wherein the plurality of drivers are synchronous with a clock pulse; and a sample amplifier to select data from the core memory in accordance with the data requested from the external elements, the sample amplifier selecting data synchronously with the clock pulse.

8. The arrangement of claim 7, the determining mechanism comprising:

a plurality of second XOR gates to subject the presently selected data and the previously selected data to a second logical XOR function; and a majority detector to whose inputs data from the second XOR gates are supplied.

9. The arrangement of claim 8, the majority detector comprising:

a first set of capacitors being charged to a voltage corresponding to a number of individual second XOR gates whose inputs are different; and a comparitor to compare a combined voltage of the first set of capacitors to a predetermined voltage.

10. The arrangement of claim 9, the majority detector further comprising a second set of capacitors to produce the predetermined voltage previous to comparing the combined voltage to the predetermined voltage.

11. The arrangement of claim 7, wherein the second XOR gates are synchronous with the clock pulse.

12. The arrangement of claim 7, further comprising a bypass route to bypass the determination mechanism and the first XOR gates such that presently selected data is driven without being compared with previously selected data.

\* \* \* \* \*